(12) United States Patent
Cho et al.

(10) Patent No.: US 8,871,430 B2
(45) Date of Patent: Oct. 28, 2014

(54) PHOTOACTIVE COMPOUND AND PHOTOSENSITIVE RESIN COMPOSITION COMPRISING THE SAME

(75) Inventors: Changho Cho, Anseong-si (KR); Won Jin Chung, Daejeon (KR); Raisa Kharbash, Daejeon (KR); Sunghyun Kim, Daejeon (KR); Dongchang Choi, Daejeon (KR); Sang Chul Lee, Daejeon (KR); Han Soo Kim, Daejeon (KR); Yoon Hee Heo, Daejeon (KR); Sunhwa Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 14/111,166

(22) PCT Filed: May 14, 2012

(86) PCT No.: PCT/KR2012/003766
§ 371 (c)(1),
(2), (4) Date: Oct. 10, 2013

(87) PCT Pub. No.: WO2013/018978
PCT Pub. Date: Feb. 7, 2013

(65) Prior Publication Data
US 2014/0220491 A1 Aug. 7, 2014

(30) Foreign Application Priority Data
Aug. 4, 2011 (KR) .................. 10-2011-0077775

(51) Int. Cl.
G03F 7/004 (2006.01)
G03F 7/028 (2006.01)
C07D 209/82 (2006.01)

(52) U.S. Cl.
USPC .................. 430/270.1; 430/281.1; 430/285.1; 430/330; 430/331; 430/322; 430/325; 430/905; 430/926; 548/440

(58) Field of Classification Search
USPC ........ 430/270.1, 281.1, 285.1, 322, 325, 330, 430/331, 905, 913, 926; 528/440
See application file for complete search history.

(56) References Cited

U.S. PATENT DOCUMENTS 8,168,369 B2 * 5/2012 Cho et al. .................. 430/270.1
2006/0241259 A1 10/2006 Tanabe et al.
(Continued)

FOREIGN PATENT DOCUMENTS

JP 2006-516246 A 6/2006
JP 2010-015025 A 1/2010
(Continued)

OTHER PUBLICATIONS

Office Action issued in Korean Patent Application No. 10-2012-0050885 on Sep. 26, 2013.

*Primary Examiner* — Amanda C. Walke
(74) *Attorney, Agent, or Firm* — Rothwell, Figg, Ernst & Manbeck, P.C.

(57) ABSTRACT

The present invention relates to a photoactive compound having a novel structure and a photosensitive resin composition including the same, and the photoactive compound according to the present invention has excellent sensitivity due to efficient absorption to a UV light source by including a nitro group and a phosphonate structure, and has excellent retention rate, mechanical strength, heat resistance, chemical resistance and developing resistance by improving solubility of the photosensitive resin composition by excellent compatibility of the phosphonate structure and a binder resin. Therefore, the photosensitive resin composition according to the present invention is useful to cure a column spacer, an overcoat, a passivation material and the like of a liquid crystal display device, and is useful in view of a high temperature process property.

18 Claims, 2 Drawing Sheets

(56) References Cited

U.S. PATENT DOCUMENTS

| | | |
|---|---|---|
| 2010/0145068 A1 | 6/2010 | Lee et al. |
| 2010/0261815 A1 | 10/2010 | Cho et al. |
| 2011/0318692 A1 | 12/2011 | Cho et al. |

FOREIGN PATENT DOCUMENTS

| | | |
|---|---|---|
| KR | 10-2009-0008534 A | 1/2009 |
| KR | 10-2009-0107977 A | 10/2009 |
| KR | 10-2010-0092904 A | 8/2010 |

* cited by examiner

PHOTOACTIVE COMPOUND AND PHOTOSENSITIVE RESIN COMPOSITION COMPRISING THE SAME

CROSS REFERENCE TO RELATED APPLICATIONS

This application is a 35 U.S.C. §371 National Phase Entry Application from PCT/KR2012/003766, filed May 14, 2012, and designating the United States, which claims priority under 35 U.S.C. §119 to Korean Patent Application No. 10-2011-0077775 filed Aug. 4, 2011, which is incorporated herein in its entirety.

TECHNICAL FIELD

This application claims priority from Korean Patent Application No. 10-2011-0077775 filed on Aug. 4, 2011, in the KIPO, the disclosure of which is incorporated herein by reference in its entirety.

The present invention relates to a photoactive compound having a novel structure and a photosensitive resin composition including the same. More particularly, the present invention relates to a photoactive compound having high absorptivity to a UV light source, excellent sensitivity and high temperature process properties and excellent compatibility in a photosensitive resin composition, and a photosensitive resin composition including the same.

BACKGROUND ART

A photoactive compound is a material that is decomposed by absorbing light to generate chemically active atoms or molecules, and extensively used in a photosensitive resin composition and the like. Examples of the chemically active material include acids, bases, radicals and the like. Among the examples, particularly, the photoactive compound generating radicals may be used together with an acryl group causing a polymerization reaction along with radicals to improve strength of a coating film.

Meanwhile, a photosensitive resin composition may be used to form a pattern by forming a coat by applying the photosensitive resin composition on a substrate, radiating light on a predetermined portion of the coat by using a photomask and the like to perform exposure, and removing a non-exposure portion by developing. Since the photosensitive resin composition can be polymerized and cured by radiating light, the photosensitive resin composition is used in photocurable ink, a photosensitive printed board, various photoresists, a color filter photoresist for LCD, a photoresist for resin black matrixes, a transparent photosensitive material or the like.

Further, the photosensitive resin composition is manufactured so as to constitute a liquid crystal display device such as a TV and a monitor in addition to a known purpose of a notebook, a mobile device and the like as LCDs are sophisticated and diversified, and rapidly responds to light to improve productivity and durability, and a demand for excellent mechanical properties thereof is growing.

Particularly, in the case where a pattern is formed by a photolithography method or an insulating protection film is formed through exposure of an entire surface, a property rapidly responding to light, that is, photosensitivity, is a very important factor. Further, a column spacer acting as a support or an overcoat and a passivation film acting as a protection film should have excellent mechanical properties so that the liquid crystal display device is not broken by an impact applied from the outside and shows an original ability.

Accordingly, if the photoactive compound having excellent photosensitivity is used, these problems can be solved. In the case where the photoactive compound having excellent photosensitivity is used, since sufficient sensitivity may be implemented even in a small amount, there are advantages in that a pollution source of liquid crystal is reduced, a retention rate of a pattern is increased, and an available range of other raw materials expands while the composition is manufactured.

DISCLOSURE

Technical Problem

The present invention has been made in an effort to provide a photoactive compound that can efficiently absorb a UV light source and has excellent sensitivity and high temperature process properties and good compatibility in a photosensitive resin composition, and a photosensitive resin composition including the same.

Technical Solution

An exemplary embodiment of the present invention provides a photoactive compound represented by the following Formula 1.

[Formula 1]

In Formula 1, $R^1$ is a $C_1$~$C_8$ alkyl group; or a $C_6$~$C_{12}$ aryl group, $R^2$ is a $C_1$~$C_8$ alkyl group; or a $C_1$~$C_8$ alkyl group substituted by one or more substituent groups selected from the group consisting of R, OR, SR and COR, $R^3$ and $R^4$ are hydrogen; or are connected to each other to form a condensed ring, $R^5$ is a $C_1$~$C_8$ alkyl group; or a $C_6$~$C_{12}$ aryl group, A is a $C_2$~$C_{15}$ alkylene group; or a $C_2$~$C_{15}$ alkylene group substituted by one or more substituent groups selected from the group consisting of R, OR, SR, COR and OCOR, and R is selected from a $C_1$~$C_{10}$ alkyl group; a $C_1$-$C_{10}$ haloalkyl group; or a $C_7$~$C_{13}$ aralkyl group.

Another exemplary embodiment of the present invention provides a photosensitive resin composition including: a) a photoactive compound represented by Formula 1; b) an alkali-soluble binder resin; c) a polymerizable compound having an ethylenically unsaturated bond; and d) a solvent.

Yet another exemplary embodiment of the present invention provides a photosensitive material manufactured by using the photosensitive resin composition.

Still another exemplary embodiment of the present invention provides an electronic device manufactured by using the photosensitive resin composition.

Advantageous Effects

A photosensitive resin composition including a photoactive compound according to an exemplary embodiment of the present invention has very excellent sensitivity due to efficient absorption to a UV light source and has excellent compatibility of the photoactive compound and an alkali-soluble binder resin to improve solubility of the photosensitive resin composition, thus improving a developing margin. Therefore, the photosensitive resin composition according to the present invention is useful to cure a column spacer, a color resist, a black matrix material and the like of a liquid crystal display device, and is useful in view of a high temperature process property.

MODE FOR INVENTION

Various advantages and features of the present invention and methods accomplishing thereof will become apparent from the following description of embodiments. However, the present invention is not limited to the exemplary embodiments to be described below but may be implemented in various forms. Therefore, the exemplary embodiments are provided to enable those skilled in the art to thoroughly understand the teaching of the present invention and to completely inform the scope of the present invention and the exemplary embodiment is just defined by the scope of the appended claims.

Unless otherwise defined, all terms used herein, including technical or scientific terms, have the same meanings as those commonly understood by those with ordinary knowledge in the field of art to which the present invention belongs. Further, such terms as those defined in a generally used dictionary are to be interpreted to have the meanings equal to the contextual meanings in the relevant field of art, and are not to be interpreted to have idealized or excessively formal meanings unless clearly defined in the present invention.

Hereinafter, the present invention will be described in more detail below.

1. Photoactive Compound

In the present invention, it can be confirmed that absorptivity to a UV light source is increased by changing a structure of a photoactive compound so that a nitro group and a phosphonate group are necessarily included as a substituent group in the photoactive compound including oxime ester as a basic structure, and when the photoactive compound is used as a photopolymerization initiator in the photosensitive resin composition, solubility is improved due to excellent compatibility to a binder resin, sensitivity is excellent, and a high temperature process property is excellent.

The photoactive compound according to an exemplary embodiment of the present invention has a structure of Formula 1.

In Formula 1, an alkyl group may be a straight chain, a branched chain or a cyclic chain. Specific examples of the alkyl group may include a methyl group, an ethyl group, a n-propyl group, an iso-propyl group, a n-butyl group, a sec-butyl group, a t-butyl group, a n-pentyl group, an iso-pentyl group, a neo-pentyl group, a n-hexyl group, a cyclopropyl group, a cyclobutyl group, a cyclopentyl group, a cyclohexyl group and the like, but are not limited thereto.

In Formula 1, the alkylene group may be a straight chain or a branched chain, and a substituted or unsubstituted matter. Specific examples of the alkylene group include methylene, ethylene, propylene, isopropylene, butylene, t-butylene and the like, but are not limited thereto.

In Formula 1, the aryl group may be a monocyclic aryl group or a polycyclic aryl group. In the case where the aryl group is the monocyclic aryl group, the number of carbon atoms is not particularly limited, and it is preferable that the number of carbon atoms be 6 to 20. Specifically, examples of the monocyclic aryl group may include a phenyl group, a biphenyl group or the like, but are not limited thereto. In the case where the aryl group is the polycyclic aryl group, the aryl group may be a naphthyl group.

In Formula 1, $R^1$ is a portion at which radicals that are active species are decomposed during exposure, and there is no particular limitation in a structure but it is preferable that $R^1$ be a methyl group or a phenyl group. This is because the structure of the methyl group or the phenyl group is simple and movable, thus improving photoinitiation efficiency.

In Formula 1, it is preferable that $R^2$ be a methyl group or an ethyl group.

In Formula 1, it is preferable that $R^3$ and $R^4$ be hydrogen or connected to each other to form a condensed ring. In the case where $R^3$ and $R^4$ are connected to each other to form a condensed ring, a 5-, 6- or 7-membered ring may be formed, a monocycle or polycyclic shape may be ensured, and an aromatic or aliphatic cycle or a heteroaromatic or heteroaliphatic cycle may be obtained.

In Formula 1, $R^5$ is preferably a methyl group or an ethyl group, and more preferably an ethyl group.

In Formula 1, A is preferably a hexylene group or a propylene group in view of solubility and compatibility, and more preferably a propylene group.

The photoactive compound of the present invention represented by Formula 1 basically includes an oxime ester group in a structure thereof, and includes a nitro group (—$NO_2$) and a phosphonate group (—$PO(OR^5)_2$) at a predetermined position thereof.

The nitro group moves a UV maximum absorption wavelength of the compound represented by Formula 1 to about 370 nm that is a long wavelength so as to more efficiently absorb light of i-line ($\lambda$=365 nm) that is a maximum light emitting wavelength of a general mercury light source exposing device, thus increasing sensitivity.

Further, the phosphonate group increases solubility of the compound represented by Formula 1, and forms a hydrogen bond and the like together with the alkali-soluble binder resin in the photosensitive resin composition to improve solubility of the photosensitive resin composition and reduce volatility due to high compatibility with the binder resin. The photoactive compound according to the present invention has a high sensitivity property, excellent solubility and low volatility due to the aforementioned structural feature as compared to a known photoactive compound including oxime ester, such that it is possible to improve sensitivity, chemical resistance, developing resistance, hardness and a high temperature process property by using the photoactive compound as the photopolymerization initiator in the photosensitive resin composition.

Meanwhile, the method of manufacturing the photoactive compound represented by Formula 1 according to the exemplary embodiment of the present invention is not particularly limited, but the compound may be manufactured by the following method.

First, carbazole and haloalkanes such as dibromoalkane or bromochloroalkane are reacted to obtain haloalkylcarbazole, haloalkylcarbazole is reacted with trialkyl phosphite to obtain a phosphonate compound, the phosphonate compound is reacted with copper nitrate to obtain a nitrocarbazole compound, the nitrocarbazole compound and acid chlorides are reacted in the presence of aluminum chloride to obtain an acyl compound, the acyl compound is reacted with hydroxylamine hydrochloride to obtain an oxime compound, and the oxime compound is reacted with acid anhydrides or acid chlorides to obtain an oxime ester photoactive compound of Formula 1 of the present invention.

The aforementioned Reaction Equation is specifically shown in the following Reaction Equation 1.

[Reaction Equation 1]

-continued

2. Photosensitive Resin Composition

The photosensitive resin composition according to the exemplary embodiment of the present invention uses the photoactive compound represented by Formula 1 as a photopolymerization initiator, and includes the alkali-soluble binder resin, the polymerizable compound having the ethylenically unsaturated bond and the solvent.

The content of the photoactive compound represented by Formula 1 may be 0.1 to 5 wt % based on the entire photosensitive resin composition, but is not limited thereto. In the case where the content is less than 0.1 wt %, sufficient sensitivity may not be provided, and in the case where the content is more than 5 wt %, UV rays may not reach to the bottom due to high UV absorption.

Since the photosensitive resin composition according to the exemplary embodiment of the present invention includes the binder resin, there is an effect of controlling viscosity and there is an effect that patterning using an alkali developing solution is feasible. Matters, such as an alkali-soluble polymer resin, which are generally used in the art may be used as the binder resin. Specifically, the alkali-soluble resin binder may be a compound manufactured through a polymer reaction of a monomer including an acid functional group, a copolymer with a monomer that can be copolymerized therewith, or the ethylenically unsaturated compound including the copolymer and an epoxy group.

Non-limiting examples of the monomer including the acid functional group include matters selected from the group consisting of a (metha)acrylic acid, a crotonic acid, an itaconic acid, a maleic acid, a fumaric acid, a monomethyl maleic acid, isoprene sulfonate, styrene sulfonate, a 5-nobonen-2-carboxylic acid, mono-2-((metha)acryloyloxy) ethyl phthalate, mono-2-((metha)acryloyloxy)ethyl succinate, and ω-carboxypolycaprolactone mono(metha)acrylate and a mixture thereof.

Non-limiting examples of the monomer that can be copolymerized with the monomer including the acid functional group include unsaturated ester carboxylates selected from the group consisting of benzyl (metha)acrylate, methyl (metha)acrylate, ethyl (metha)acrylate, butyl (metha)acrylate, dimethylaminoethyl (metha)acrylate, isobutyl (metha) acrylate, t-butyl (metha)acrylate, cyclohexyl (metha)acrylate, isobonyl (metha)acrylate, ethylhexyl (metha)acrylate, 2-phenoxyethyl (metha)acrylate, tetrahydrofurfuryl (metha) acrylate, hydroxyethyl (metha)acrylate, 2-hydroxypropyl (metha)acrylate, 2-hydroxy-3-chloropropyl (metha)acrylate, 4-hydroxybutyl (metha)acrylate, acyloctyloxy-2-hydroxypropyl (metha)acrylate, glycerol (metha)acrylate, 2-methoxyethyl (metha)acrylate, 3-methoxybutyl (metha)acrylate, ethoxydiethyleneglycol (metha)acrylate, methoxytriethyleneglycol (metha)acrylate, methoxytripropyleneglycol (metha)acrylate, polyethylene glycol)methylether (metha) acrylate, phenoxydiethyleneglycol (metha)acrylate, p-nonylphenoxypolyethyleneglycol (metha)acrylate, p-nonylphenoxypolypropyleneglycol (metha)acrylate, tetrafluoropropyl (metha)acrylate, 1,1,1,3,3,3-hexafluoroisopropyl (metha) acrylate, octafluoropentyl (metha)acrylate, heptadecafluorodecyl (metha)acrylate, tribromophenyl (metha)acrylate, methyl α-hydroxymethyl acrylate, ethyl α-hydroxymethyl acrylate, propyl α-hydroxymethyl acrylate, butyl α-hydroxymethyl acrylate, dicyclopentanyl (metha)acrylate, dicyclopentenyl (metha)acrylate, dicyclopentanyloxyethyl (metha)acrylate and dicyclopentenyloxyethyl (metha)acrylate;

aromatic vinyls selected from the group consisting of styrene, α-methylstyrene, (o,m,p)-vinyltoluene, (o,m,p)-methoxystyrene, and (o,m,p)-chlorostyrene;

unsaturated ethers selected from the group consisting of vinyl methyl ether, vinyl ethyl ether and allyl glycidyl ether;

N-vinyl tertiary amines selected from the group consisting of N-vinyl pyrrolidone, N-vinyl carbazole and N-vinyl morpholine;

unsaturated imides selected from the group consisting of N-phenyl maleimide, N-(4-chlorophenyl) maleimide, N-(4-hydroxyphenyl) maleimide, N-cyclohexyl maleimide and N-benzyl maleimide;

maleic anhydrides such as maleic anhydride or methylmaleic anhydride;

unsaturated glycidyl compounds selected from the group consisting of allyl glycidyl ether, glycidyl (metha)acrylate and 3,4-epoxycyclohexylmethyl (metha)acrylate; and a mixture thereof.

The acid value of the alkali-soluble binder resin used in the present invention may be about 30 to 300 KOH mg/g. In the case where the acid value is less than 30 KOH mg/g, developing is not well performed, thus, a clean pattern may not be obtained, and in the case where the acid value is more than 300 KOH mg/g, a washing property is excessively improved, thus the pattern may be removed.

Further, the weight average molecular weight of the alkali-soluble binder resin is in the range of preferably 1,000 to 200,000 and more preferably 5,000 to 100,000. In the case where the weight average molecular weight of the alkali-soluble binder resin is less than 1,000, heat resistance and chemical resistance are deteriorated, and in the case where the weight average molecular weight of the alkali-soluble binder resin is more than 200,000, solubility to the developing solution is reduced to hinder developing and viscosity of the solution is excessively increased to make uniform coating difficult, which are not preferable.

In the photosensitive resin composition according to the exemplary embodiment of the present invention, the content of the binder resin may be 1 to 30 wt % based on the total weight of the photosensitive resin composition, but is not limited thereto. If the content of the binder resin is 1 wt % or more, there is an effect that patterning using the alkali aqueous solution is well performed, and it is possible to prevent a problem that it is difficult to form the pattern because solubility to the developing solution is not well exhibited, and if the content of the binder resin is 30 wt % or less, there are effects that it is possible to prevent removal of the pattern during the developing process and prevent occurrence of a problem that it is difficult to perform coating due to excessively high viscosity of the entire solution.

The photosensitive resin composition according to the exemplary embodiment of the present invention may include a crosslinking compound, and specifically, a crosslinking compound including an ethylenically unsaturated group may be used. To be more specific, a crosslinking compound including two or more unsaturated acryl groups or a crosslinking compound including three or more unsaturated acryl groups may be used. Specific examples thereof include a compound obtained by esterifying polyhydric alcohols of ethyleneglycol di(metha)acrylate, polyethyleneglycol di(metha)acrylate having the number of ethylene groups of 2 to 14, trimethylolpropane di(metha)acrylate, trimethylolpropane tri(metha)acrylate, pentaerythritol tri(metha)acrylate, pentaerythritol tetra(metha)acrylate, 2-trisacryloyloxymethylethyl phthalate, propyleneglycol di(metha)acrylate having the number of propylene groups of 2 to 14, dipentaerythritol penta(metha)acrylate, dipentaerythritol hexa(metha)acrylate and a mixture of acidic modified matter of dipentaerythritol penta(metha)acrylate and dipentaerythritol hexa(metha)acrylate by α,β-unsaturated carboxylic acid;

a compound obtained by adding (metha)acrylic acid to a compound including a glycidyl group such as a trimethylolpropane triglycidylether acrylate addition material and a bisphenol A diglycidylether acrylate addition material;

ester compounds of the compound having a hydroxy group or an ethylenically unsaturated bond and polyvalent carboxylic acid, such as diester phthalates of β-hydroxyethyl (metha)acrylate and toluene diisocyanate addition materials of β-hydroxyethyl (metha)acrylate, or addition materials with polyisocyanate, where examples of the compound having the ethylenically unsaturated bond include one or more kinds selected from the group consisting of allyl glycidyl ether, glycidyl (metha)acrylate, 3,4-epoxycyclohexylmethyl (metha)acrylate, glycidyl 5-norbornene-2-methyl-2-carboxylate (endo and exo mixtures), 1,2-epoxy-5-hexene, and 1,2-epoxy-9-decene;

alkylester (metha)acrylate selected from the group consisting of methyl (metha)acrylate, ethyl (metha)acrylate, butyl (metha)acrylate and 2-ethylhexyl (metha)acrylate; and one or more kinds selected from the group consisting of 9,9'-bis[4-(2-acryloyloxyethoxy)phenyl]fluorene, but are not limited thereto and compounds that are known in the art may be used.

Further, in some cases, a silica dispersion element may be used in these compounds, and examples thereof include Nanocryl XP series (0596, 1045, 21/1364) and Nanopox XP series (0516, 0525) manufactured by Hanse Chemie Co., Ltd.

In the photosensitive resin composition according to the exemplary embodiment of the present invention, the content of the crosslinking compound may be 0.5 to 30 wt % based on the total weight of the photosensitive resin composition, but is not limited thereto. In the case where the content is less than 0.5 wt %, a crosslinking reaction by light is not performed, which is not preferable, and if the content is more than 30 wt %, there is a disadvantage in that it is difficult to form a pattern because solubility to alkali is reduced.

In the photosensitive resin composition according to the exemplary embodiment of the present invention, non-limiting examples of the solvent may include one or more kinds selected from the group consisting of methyl ethyl ketone, methyl cellosolve, ethyl cellosolve, ethyleneglycol dimethyl ether, ethyleneglycol diethyl ether, propyleneglycol dimethyl ether, propyleneglycol diethyl ether, diethyleneglycol dimethylether, diethyleneglycol diethylether, diethyleneglycol methyl ethyl ether, 2-ethoxy propanol, 2-methoxy propanol, 3-methoxy butanol, cyclohexanone, cyclopentanone, propyleneglycol methyl ether acetate, propyleneglycol ethyl ether acetate, 3-methoxybutyl acetate, ethyl 3-ethoxypropionate, ethylcellosolve acetate, methylcellosolve acetate, butyl acetate and dipropyleneglycol monomethyl ether.

In the photosensitive resin composition according to the exemplary embodiment of the present invention, the content of the solvent may be 40 to 95 wt % based on the total weight of the photosensitive resin composition, but is not limited thereto.

The photosensitive resin composition according to the exemplary embodiment of the present invention is a transparent photosensitive resin composition, and may include 0.1 to 5 wt % of the photoactive compound represented by Formula 1, 0.5 to 30 wt % of the polymerizable compound having the ethylenically unsaturated bond, 1 to 30 wt % of the alkali-soluble binder resin and 40 to 95 wt % of the solvent.

The photosensitive resin composition according to the exemplary embodiment of the present invention may further include a colorant.

In the photosensitive resin composition according to the exemplary embodiment of the present invention, one or more kinds of pigments or dyes or mixtures thereof may be used as the colorant. Specifically, metal oxides such as carbon black, graphite, and titanium black may be used as a black pigment. Examples of the carbon black include Cisto 5HIISAF-HS, Cisto KH, Cisto 3HHAF-HS, Cisto NH, Cisto 3M, Cisto 300HAF-LS, Cisto 116HMMAF-HS, Cisto 116MAF, Cisto FMFEF-HS, Cisto SOFEF, Cisto VGPF, Cisto SVHSRF-HS, and Cisto SSRF (Donghae Carbon Co., Ltd.); Diagram black II, Diagram black N339, Diagram black SH, Diagram black H, Diagram LH, Diagram HA, Diagram SF, Diagram N550M, Diagram M, Diagram E, Diagram G, Diagram R, Diagram N760M, Diagram LR, #2700, #2600, #2400, #2350, #2300, #2200, #1000, #980, #900, MCF88, #52, #50, #47, #45, #45L, #25, #CF9, #95, #3030, #3050, MA7, MA77, MA8, MA11, MA100, MA40, OIL7B, OIL9B, OIL11B, OIL30B, and OIL31B (Mitsubishi Chemical Co., Ltd.); PRINTEX-U, PRINTEX-V, PRINTEX-140U, PRINTEX-140V, PRINTEX-95, PRINTEX-85, PRINTEX-75, PRINTEX-55, PRINTEX-45, PRINTEX-300, PRINTEX-35, PRINTEX-25, PRINTEX-200, PRINTEX-40, PRINTEX-30, PRINTEX-3, PRINTEX-A, SPECIAL BLACK-550, SPECIAL BLACK-350, SPECIAL BLACK-250, SPECIAL BLACK-100, and LAMP BLACK-101 (Degussa Co., Ltd.); RAVEN-1100ULTRA, RAVEN-1080ULTRA, RAVEN-1060ULTRA, RAVEN-1040, RAVEN-1035, RAVEN-1020, RAVEN-1000, RAVEN-890H, RAVEN-890, RAVEN-880ULTRA, RAVEN-860ULTRA, RAVEN-850, RAVEN-820, RAVEN-790ULTRA, RAVEN-780ULTRA, RAVEN-760ULTRA, RAVEN-520, RAVEN-500, RAVEN-460, RAVEN-450, RAVEN-430ULTRA, RAVEN-420, RAVEN-410, RAVEN-2500ULTRA, RAVEN-2000, RAVEN-1500, RAVEN-1255, RAVEN-1250, RAVEN-1200, RAVEN-1190ULTRA, and RAVEN-1170 (Columbia Carbon Co., Ltd.), mixtures thereof or the like. Further, examples of the colorant exhibiting a color include carmine 6B (C.I. 12490), phthalocyanine green (C.I. 74260), phthalocyanine blue (C.I. 74160), perylene black (BASF K0084. K0086), cyanine black, linol yellow (C.I. 21090), linol yellow GRO(C.I. 21090), benzidine yellow 4T-564D, victoria pure blue (C.I. 42595), C.I. PIGMENT RED 3, 23, 97, 108, 122, 139, 140, 141, 142, 143, 144, 149, 166, 168, 175, 177, 180, 185, 189, 190, 192, 202, 214, 215, 220, 221, 224, 230, 235, 242, 254, 255, 260, 262, 264, and 272; C.I. PIGMENT GREEN 7, 36, 58; C.I. PIGMENT blue 15:1, 15:3, 15:4, 15:6, 16, 22, 28, 36, 60, and 64; C.I. PIGMENT yellow 13, 14, 35, 53, 83, 93, 95, 110, 120, 138, 139, 150, 151, 154, 175, 180, 181, 185, 194, and 213; C.I. PIGMENT VIOLET 15, 19, 23, 29, 32, 37 and the like, and in addition to this, a white pigment, a fluorescent pigment or the like may be used. A material in which zinc is used as the central metal other than copper may be used as the phthalocyanine-based complex compound used as the pigment.

In the photosensitive resin composition according to the exemplary embodiment of the present invention, the content of the colorant may be 1 to 20 wt % based on the total weight of the photosensitive resin composition, but is not limited thereto.

The photosensitive resin composition according to the exemplary embodiment of the present invention is a colored photosensitive resin composition, and may include 0.1 to 5 wt % of the photoactive compound represented by Formula 1, 0.5 to 30 wt % of the polymerizable compound having the ethylenically unsaturated bond, 1 to 30 wt % of the alkali-soluble binder resin, 1 to 20 wt % of a colorant and 40 to 95 wt % of the solvent.

The photosensitive resin composition according to the exemplary embodiment of the present invention may further include one or two or more additives such as a second photoactive compound, a curing accelerator, a thermal polymerization inhibitor, a dispersing agent, an antioxidant, a UV absorbent, a leveling agent, a photosensitizer, a plasticizer, an adhesion promoter, a filler or a surfactant in addition to the aforementioned constituent components, if necessary.

The second photoactive compound may be specifically selected from the group consisting of a triazine-based compound, a biimidazole-based compound, an acetophenone-based compound, an O-acyloxime-based compound, a benzophenone-based compound, a thioxantone-based compound, a phosphine oxide-based compound and a coumarine-based compound. More specific examples of the second photoactive compound include a triazine-based compound selected from the group consisting of 2,4-trichloromethyl-(4'-methoxyphenyl)-6-triazine, 2,4-trichloromethyl-(4'-methoxystyryl)-6-triazine, 2,4-trichloromethyl-(perfluonyl)-6-triazine, 2,4-trichloromethyl-(3',4'-dimethoxyphenyl)-6-triazine, 3-{4-[2,4-bis(trichloromethyl)-s-triazine-6-yl]phenylthio}propanic acid, 2,4-trichloromethyl-(4'-ethylbiphenyl)-6-triazine and 2,4-trichloromethyl-(4'-methylbiphenyl)-6-triazine;

a biimidazole compound selected from the group consisting of 2,2'-bis(2-chlorophenyl)-4,4',5,5'-tetraphenyl biimidazole and 2,2'-bis(2,3-dichlorophenyl)-4,4',5,5'-tetraphenylbi-imidazole;

an acetophenone-based compound selected from the group consisting of 2-hydroxy-2-methyl-1-phenylpropane-1-on, 1-(4-isopropylphenyl)-2-hydroxy-2-methylpropane-1-on, 4-(2-hydroxyethoxy)-phenyl(2-hydroxy)propyl ketone, 1-hydroxycyclohexyl phenyl ketone, 2,2-dimethoxy-2-phenylacetophenone, 2-methyl-(4-methylthiophenyl)-2-morpholino-1-propane-1-on (Irgacure-907) and 2-benzyl-2-dimethylamino-1-(4-morpholinophenyl)-butane-1-on (Irgacure-369);

an O-acyloxime-based compound such as Irgacure OXE 01 and Irgacure OXE 02 manufactured by BASF Co., Ltd. and N-1919, NCI-831 and NCI-930 manufactured by ADEKA Co., Ltd.;

a benzophenone-based compound such as 4,4'-bis(dimethylamino)benzophenone and 4,4'-bis(diethylamino)benzophenone;

a thioxantone-based compound selected from the group consisting of 2,4-diethyl thioxantone, 2-chloro thioxantone, isopropyl thioxantone and diisopropyl thioxantone;

a phosphine oxide-based compound selected from the group consisting of 2,4,6-trimethylbenzoyl diphenylphosphine oxide, bis(2,6-dimethoxybenzoyl)-2,4,4-trimethylpentyl phosphine oxide and bis(2,6-dichlorobenzoyl) propyl phosphine oxide;

a coumarine-based compound selected from the group consisting of 3,3'-carbonylvinyl-7-(diethylamino)coumarine, 3-(2-benzothiazolyl)-7-(diethylamino)coumarine, 3-benzoyl-7-(diethylamino)coumarine, 3-benzoyl-7-methoxy-coumarine and 10,10'-carbonylbis[1,1,7,7-tetramethyl-2,3,6,7-tetrahydro-1H,5H,11H-Cl]-benzopyrano[6,7,8-ij]-quinolizine-11-on.

Examples of the curing accelerator may include one or more kinds selected from the group consisting of 2-mercaptobenzoimidazole, 2-mercaptobenzothiazole, 2-mercaptobenzoxazole, 2,5-dimercapto-1,3,4-thiadiazole, 2-mercapto-4,6-dimethylaminopyrydine, pentaerythritol tetrakis(3-mercaptopropionate), pentaerythritol tris(3-mercaptopropionate), pentaerythritol tetrakis(2-mercaptoacetate), pentaerythritol tris(2-mercaptoacetate), trimethylolpropane tris(2-mercaptoacetate), trimethylolpropane tris(3-mercaptopropionate), trimethylolethane tris(2-mercaptoacetate), and trimethylolethane tris(3-mercaptopropionate), but are not limited thereto, and may include matters that are known in the art.

Examples of the thermal polymerization inhibitor may include one or more kinds selected from the group consisting of p-anisole, hydroquinone, pyrocatechol, t-butyl catechol, N-nitrosophenylhydroxyamine ammonium salts, N-nitrosophenylhydroxyamine aluminum salts and phenothiazine, but are not limited thereto, and may include matters that are known in the art.

In the photosensitive resin composition according to the exemplary embodiment of the present invention, a polymer type, nonionic, anionic or cationic dispersing agent may be used as the dispersing agent. Non-limiting examples of the dispersing agent may include polyalkyleneglycol and esters thereof, polyoxyalkylene polyhydric alcohols, esteralkylene oxide additions, alcoholalkylene oxide additions, ester sulfonate, sulfonates, ester carboxylates, carboxylates, alkylamide alkylene oxide additions, alkylamine and the like, one kind or a mixture of two or more kinds selected from the examples may be used, but the examples are not limited thereto.

Non-limiting examples of the antioxidant may include one or more kinds selected from 2,2-thiobis(4-methyl-6-t-butylphenol) and 2,6-g,t-butylphenol, but are not limited thereto.

Non-limiting examples of the UV absorbent may include one or more kinds selected from 2-(3-t-butyl-5-methyl-2-hydroxyphenyl)-5-chloro-benzotriazol and alkoxy benzophenone, but are not limited thereto.

Examples of the surfactant may include MCF 350SF, F-475, F-488, F-552 (hereinafter, DIC Co., Ltd.) and the like, but are not limited thereto.

All compounds that can be included in a known photosensitive resin composition may be used as the leveling agent, the photosensitizer, the plasticizer, the adhesion promoter, the filler and the like.

In the case where other components are added to the photosensitive resin composition of the present invention, it is preferable that the second photoactive compound be included in a content of 0.1 to 5 wt % and residual additives be each included in a content of 0.01 to 5 wt %.

The photosensitive resin composition according to the exemplary embodiment of the present invention is used in a roll coater, a curtain coater, a spin coater, a slot die coater, and various printings, dipping and the like, and may be applied on a support of metal, paper, glass, and plastic substrates.

In addition, the composition may be transferred on the other support after being applied on the support such as a film, or may be transferred on a blanket after being applied on a first support and transferred on a second support again, but the application method thereof is not particularly limited.

Examples of a light source for curing the photosensitive resin composition of the present invention include a mercury vapor arc, a carbon arc, and a Xe arc emitting light having a wavelength of 250 to 450 nm.

The photosensitive resin composition including the compound of the present invention is preferably used in a pigment dispersion type photosensitive material for manufacturing a TFT LCD color filter, a photosensitive material for forming a black matrix of a TFT LCD or organic light emitting diode, a photosensitive material for forming an overcoat layer, a photosensitive material for a column spacer, a photosensitive material for a printed circuit board, and other transparent photosensitive materials, but may be used in manufacturing a photocurable paint, photocurable ink, photocurable adhesive, a printed board and a PDP, and the purpose thereof is not particularly limited.

The exemplary embodiment of the present invention provides an electronic device manufactured by using the photosensitive resin composition.

Hereinafter, preferable Examples will be described in order to help understanding of the present invention. However, the following Examples are set forth to illustrate the present invention, but the scope of the present invention is not limited thereto. Further, only a portion of examples according to the present invention is shown in the following Examples, but, substantially, even in the case where equivalents thereof are used, it is clear to the person with ordinary skill in the art that the same effect as the present invention can be exhibited.

SYNTHETIC EXAMPLE 1

Manufacturing of Photoactive Compound 1

(1) Manufacturing of 9-(3-chloropropyl)-carbazole (9-(3-chloropropyl)-carbazole, 1b)

1.3 g (4.0 mmol) of tetrabutylammonium bromide, 47.2 g (300 mmol) of 1-bromo-3-chloropropane and 300 mL of the 50% sodium hydroxide aqueous solution were slowly added to the solution where 33.4 g (200 mmol) of carbazole represented by Formula 1a was dissolved in 100 mL of tetrahydrofuran in a nitrogen atmosphere. The mixture was agitated at 40° C. for 5 hours. After the organic layer was separated by adding 100 g of ethyl acetate and 300 g of water, water was removed by magnesium sulfate anhydride and the solvent was removed in a vacuum to obtain 47.8 g of compound 1b. (yield: 98%)

1H NMR (500 MHz, CDCl$_3$, ppm): 8.07 (2H, d, ArH), 7.44 (2H, t, ArH), 7.43 (2H, d, ArH), 7.22 (2H, t, ArH), 4.44 (2H, t, CH$_2$), 3.45 (2H, t, CH$_2$), 2.30-2.25 (2H, m, CH$_2$).

(2) Manufacturing of 1c 12.2 g (50 mmol) of compound 1b obtained in (1) was dissolved in 84 g (500 mmol) of triethyl phosphite, and then agitated in a nitrogen atmosphere at 150° C. for 18 hours. After the mixture was cooled to normal temperature, the residual solvent was removed in a vacuum. The residual material was dissolved in 100 mL of ethyl acetate and passed through the silica gel, and the solvent was removed in a vacuum to obtain 10.1 g of the compound represented by Formula 1c. (yield: 58%)

1H NMR (500 MHz, CDCl$_3$, ppm): 8.09 (2H, d, ArH), 7.45 (2H, t, ArH), 7.44 (2H, d, ArH), 7.23 (2H, t, ArH), 4.42 (2H, t, CH$_2$), 4.18-4.02 (4H, m, 2OCH$_2$), 2.25-2.12 (2H, m, CH$_2$), 1.80-1.67 (2H, m, CH$_2$), 1.33-1.25 (6H, m, 2CH$_3$).

(3) Manufacturing of 1d 2.4 g (10 mmol) of copper nitrate hydrate was added to the solution obtained by mixing 20 mL of acetic acid and 40 mL of acetic anhydride, and then agitated at normal temperature for 10 min. 9.2 g (20 mmol) of compound 1c obtained in (2) was dissolved in 20 mL of acetic acid, and then slowly and gradually added to the aforementioned solution. After the additional agitation was performed for 2 hours, the reactant was poured into the beaker including ice water, and the generated solid precipitate was filtered by the filter, washed with water, and dried to obtain 5.0 g of compound 1d. (yield: 64%)

1H NMR (500 MHz, CDCl₃, ppm): 9.00 (1H, s, ArH), 8.39 (1H, d, ArH), 8.14 (1H, d, ArH), 7.59-7.46 (3H, m, ArH), 7.37-7.26 (1H, m, ArH), 4.50 (2H, t, CH₂), 4.16-4.04 (4H, m, 2OCH₂), 2.27-2.15 (2H, m, CH₂), 1.85-1.64 (2H, m, CH₂), 1.35-1.25 (6H, m, 2CH₃).

(4) Manufacturing of 1e

After 5.0 g (12.8 mmol) of compound 1d obtained in (3) and 2.8 g (16.6 mmol) of 2-methoxybenzoyl chloride were dissolved in 50 mL of dichloromethane, 2.6 g (19.2 mmol) of aluminum chloride was slowly and gradually added thereto at 0 to 10° C. After the additional agitation was performed for 2 hours at this temperature, the temperature was increased to normal temperature, and the additional agitation was performed for 5 hours. After the reactant was poured into the beaker including ice water, the organic layer was extracted and washed with the saturated NaHCO₃ aqueous solution, water was removed by magnesium sulfate anhydride, the solvent was removed in a vacuum, and purification was performed by the column (ethyl acetate:methanol=10:1) to obtain 4.1 g of acylated material 1e. (yield: 61%)

1H NMR (500 MHz, CDCl₃, ppm): 8.95 (1H, s, ArH), 8.54 (1H, s, ArH), 8.40 (1H, d, ArH), 8.19 (1H, d, ArH), 7.59-7.51 (3H, m, ArH), 7.41 (1H, d, ArH), 7.14-7.08 (2H, m, ArH), 4.53 (2H, t, CH₂), 4.16-4.05 (4H, m, 2CH₂), 3.76 (3H, s, CH₃), 2.30-2.16 (2H, m, CH₂), 1.85-1.68 (2H, m, CH₂), 1.35-1.24 (6H, m, 2CH₃).

(5) Manufacturing of 1f 1.40 g (20.1 mmol) of hydroxyamine hydrochloride and 2.20 g (26.8 mmol) of sodium acetate were added to the solution where 3.5 g (6.7 mmol) of compound 1e obtained in (4) was dissolved in 10 g of ethanol. The reactant was refluxed and agitated for 6 hours, cooled to normal temperature, and diluted by dichloromethane, and the solid precipitate was filtered by the filter and dried. The solid precipitate was diluted again by dichloromethane and then washed by the saturated NaHCO₃ aqueous solution, water was removed by magnesium sulfate anhydride, the solvent was removed in a vacuum, and recrystallization was performed in ethyl acetate to obtain 2.15 g of 1f. (yield: 60%)

1H NMR (500 MHz, CDCl₃, ppm): 8.80 (1H, d, ArH), 8.30 (1H, dd, ArH), 8.08 (1H, d, ArH), 7.84 (1H, dd, ArH), 7.20-7.42 (4H, m, ArH), 7.22 (1H, d, ArH), 7.16-7.04 (2H, m, ArH), 4.52 (2H, t, NCH₂), 4.16-4.06 (4H, m, 2CH₂), 3.76 (3H, s, CH₃), 2.29-2.17 (2H, m, CH₂), 1.76 (2H, dt, PCH₂), 1.31 (6H, t, 2CH₃)

(6) Manufacturing of photoactive compound 1

0.61 g (6.0 mmol) of acetic anhydride was added to the solution where 2.15 g (4.0 mmol) of compound 1f obtained in (5) was dissolved in 10 g of n-butyl acetate. This reactant was agitated at 90° C. for 2 hours, cooled to normal temperature, diluted by ethyl acetate, and washed by the saturated NaHCO$_3$ aqueous solution, water was removed by magnesium sulfate anhydride, the solvent was removed in a vacuum, and recrystallization was performed in t-butylmethyl ether to obtain 1.21 g of compound 1. (yield: 52%). The measurement result of the photoactive compound represented by Formula 1 by using $^1$H-NMR is as follows.

1H NMR (500 MHz, CDCl$_3$, ppm): 8.91 (1H, d, ArH), 8.38 (1H, dd, ArH), 8.18 (1H, d, ArH), 8.07 (1H, dd, ArH), 7.54-7.49 (3H, m, ArH), 7.17 (1H, d, ArH), 7.13-7.08 (2H, m, ArH), 4.51 (2H, t, NCH$_2$), 4.13-4.06 (4H, m, 2CH$_2$), 3.78 (3H, s, CH$_3$), 2.24-2.16 (2H, m, CH$_2$), 2.10 (3H, s, COCH$_3$), 1.80-1.73 (2H, m, CH$_2$), 1.31 (6H, t, 2CH$_3$)

SYNTHETIC EXAMPLE 2

Manufacturing of Photoactive Compound 2

The reaction was performed by using the same method as Synthetic Example 1 to obtain the photoactive compound represented by Formula 2, except that 4-methoxybenzoyl chloride 2.8 g was used instead of 2-methoxybenzoyl chloride in step (4) of Synthetic Example 1. The measurement result of the photoactive compound represented by the following Formula 2 by using $^1$H-NMR is as follows.

[Formula 2]

1H NMR (500 MHz, CDCl$_3$, ppm): 8.93 (1H, s, ArH), 8.39 (1H, d, ArH), 8.20 (1H, s, ArH), 7.97 (1H, d, ArH), 7.53 (3H, t, ArH), 7.37 (2H, d, ArH), 7.03 (2H, d, ArH), 4.52 (2H, t, NCH$_2$), 4.13-4.07 (4H, m, 2CH$_2$), 3.93 (3H, s, OCH$_3$), 2.25-2.19 (2H, m, CH$_2$), 2.16 (3H, s, COCH$_3$), 1.79-1.73 (2H, m, CH$_2$), 1.31 (6H, t, 2CH$_3$)

SYNTHETIC EXAMPLE 3

Manufacturing of Photoactive Compound 3

The reaction was performed by using the same method as Synthetic Example 1 to obtain the photoactive compound represented by Formula 3, except that 2-ethoxybenzoyl chloride 2.8 g was used instead of 2-methoxybenzoyl chloride in step (4) of Synthetic Example 1. The measurement result of the photoactive compound represented by the following Formula 3 by using $^1$H-NMR is as follows.

[Formula 3]

1H NMR (500 MHz, CDCl$_3$, ppm): 8.91 (1H, s, ArH), 8.38 (1H, d, ArH), 8.20 (1H, s, ArH), 8.04 (1H, d, ArH), 7.52-7.48 (3H, m, ArH), 7.18 (1H, d, ArH), 7.10-7.05 (2H, m, ArH), 4.51 (2H, t, NCH$_2$), 4.13-4.06 (4H, m, 2CH$_2$), 4.05-4.01 (2H, q, CH$_2$), 2.29-2.17 (2H, m, CH$_2$), 2.10 (3H, s, COCH$_3$), 1.80-1.73 (2H, m, PCH$_2$), 1.31 (6H, t, 2CH$_3$), 1.18 (3H, t, CH$_3$)

SYNTHETIC EXAMPLE 4

Manufacturing of Photoactive Compound 4

The reaction was performed by using the same method as Synthetic Example 1 to obtain the photoactive compound represented by the following Formula 4, except that 2,4-dimethoxybenzoyl chloride 2.8 g was used instead of 2-methoxybenzoyl chloride in step (4) of Synthetic Example 1. The measurement result of the photoactive compound represented by the following Formula 4 by using $^1$H-NMR is as follows.

[Formula 4]

1H NMR (500 MHz, CDCl$_3$, ppm): 8.93 (1H, d, ArH), 8.39 (1H, dd, ArH), 8.18 (1H, d, ArH), 8.08 (1H, dd, ArH), 7.53-7.49 (2H, m, ArH), 7.08 (1H, d, ArH), 6.64-6.62 (2H, m, ArH), 4.51 (2H, t, NCH$_2$), 4.14-4.06 (4H, m, 2OCH$_2$), 3.94 (3H, s, CH$_3$), 3.75 (3H, s, CH$_3$), 2.26-2.17 (2H, m, CH$_2$), 2.12 (3H, s, COCH$_3$), 1.76 (2H, dt, PCH$_2$), 1.31 (6H, t, 2CH$_3$)

SYNTHETIC EXAMPLE 5

Manufacturing of Photoactive Compound 5

The reaction was performed by using the same method as Synthetic Example 1 to obtain the photoactive compound represented by the following Formula 5, except that 2,4-dimethoxybenzoyl chloride 2.8 g was used instead of 2-methoxybenzoyl chloride in step (4) of Synthetic Example 1. The measurement result of the photoactive compound represented by the following Formula 5 by using ¹H-NMR is as follows.

[Formula 5]

1H NMR (500 MHz, CDCl$_2$, ppm): 8.92 (1H, s, ArH), 8.39 (1H, d, ArH), 8.21 (1H, s, ArH), 8.03 (1H, d, ArH), 7.53-7.48 (3H, m, ArH), 7.18 (1H, d, ArH), 7.11 (2H, t, ArH), 4.51 (2H, t, NCH$_2$), 4.13-4.07 (6H, m, 3CH$_2$), 3.55 (2H, t, CH$_2$), 3.34 (2H, q, CH$_2$), 2.24-2.17 (2H, m, CH$_2$), 2.09 (3H, s, COCH$_2$), 1.80-1.73 (2H, m, PCH$_2$), 1.31 (6H, t, 2CH$_3$), 0.98 (3H, t, CH$_2$)

SYNTHETIC EXAMPLE 6

Manufacturing of Photoactive Compound 6

The reaction was performed by using the same method as Synthetic Example 1 to obtain the photoactive compound represented by the following Formula 6, except that 2,4-dimethoxybenzoyl chloride 2.8 g was used instead of 2-methoxybenzoyl chloride in step (4) of Synthetic Example 1. The measurement result of the photoactive compound represented by the following Formula 6 by using ¹H-NMR is as follows.

[Formula 6]

1H NMR (500 MHz, CDCl$_3$, ppm): 8.88 (1H, s, ArH), 8.37 (1H, d, ArH), 8.22 (1H, s, ArH), 8.12 (1H, d, ArH), 7.88 (1H, d, ArH), 7.81 (1H, d, ArH), 7.65 (1H, s, ArH), 7.56 (1H, t, ArH), 7.51 (2H, d, ArH), 7.44 (1H, t, ArH), 7.33 (1H, s, ArH), 4.51 (2H, t, NCH$_2$), 4.13-4.06 (4H, m, 2CH$_2$), 3.89 (3H, s, OCH$_2$), 2.24-2.17 (2H, m, CH$_2$), 2.05 (3H, s, COCH$_3$), 1.79-1.72 (2H, m, PCH$_2$), 1.31 (6H, t, 2CH$_3$)

EXAMPLE 1

Manufacturing of the Transparent Photosensitive Resin Composition 10 g of the alkali-soluble binder resin that was the copolymer of benzyl methacrylate/methaacrylic acid (BzMA/MAA) (molar ratio: 70/30, Mw: 10,000, acid value 115 KOH mg/g), 17 g of dipentaerythritol hexaacrylate that was the polymerizable compound having the ethylenically unsaturated bond, 0.3 g of KBM-503 that was the adhesion aid, 0.06 g of BYK-331 that was the surfactant, 0.6 g of photoactive compound (1) manufactured in Synthetic Example 1 shown in the following Table 1, and 72.04 g of PGMEA that was the organic solvent were mixed by using the shaker for 3 hours to obtain the photosensitive resin composition solution.

EXAMPLE 2

Manufacturing of the Transparent Photosensitive Resin Composition

The photosensitive resin composition was manufactured by using the same method as Example 1, except that 0.6 g of compound (4) obtained in Synthetic Example 4 was used instead of compound (1) of the following Table 1 as the photoactive compound.

EXAMPLE 3

Manufacturing of the Transparent Photosensitive Resin Composition

The photosensitive resin composition was manufactured by using the same method as Example 1, except that 0.6 g of compound (5) obtained in Synthetic Example 5 was used instead of compound (1) of the following Table 1 as the photoactive compound.

EXAMPLE 4

Manufacturing of the Transparent Photosensitive Resin Composition

The photosensitive resin composition was manufactured by using the same method as Example 1, except that 0.6 g of compound (6) obtained in Synthetic Example 6 was used instead of compound (1) of the following Table 1 as the photoactive compound.

TABLE 1

| Classification | Formula |
|---|---|
| Compound (1) | |

TABLE 1-continued

| Classification | Formula |
|---|---|
| Compound (2) | 3-nitro-9-(3-(diethoxyphosphoryl)propyl)carbazole with (4-methoxyphenyl)(acetyloxyimino)methyl group |
| Compound (3) | 3-nitro-9-(3-(diethoxyphosphoryl)propyl)carbazole with (2-ethoxyphenyl)(acetyloxyimino)methyl group |
| Compound (4) | 3-nitro-9-(3-(diethoxyphosphoryl)propyl)carbazole with (2,4-dimethoxyphenyl)(acetyloxyimino)methyl group |
| Compound (5) | 3-nitro-9-(3-(diethoxyphosphoryl)propyl)carbazole with (2-(2-ethoxyethoxy)phenyl)(acetyloxyimino)methyl group |
| Compound (6) | 3-nitro-9-(3-(diethoxyphosphoryl)propyl)carbazole with (3-methoxynaphthalen-2-yl)(acetyloxyimino)methyl group |
| Compound (7) | 9-ethylcarbazole with (2-methylphenyl)carbonyl and 1-(acetyloxyimino)ethyl groups |
| Compound (8) | 3-nitro-9-(2-ethylhexyl)carbazole with 1-(acetyloxyimino)ethyl group |
| Compound (9) | 3-nitro-9-(3-(diethoxyphosphoryl)propyl)carbazole with 1-(acetyloxyimino)ethyl group |

COMPARATIVE EXAMPLE 1

The photosensitive resin composition was manufactured by using the same method as Example 1, except that 0.6 g of Irgacure OXE-02 (BASF Co., Ltd.) of compound (7) was used instead of compound (1) of Table 1 as the photoactive compound.

Evaluation of Physical Properties 1

The transparent photosensitive resin composition manufactured in Examples 1 to 4 and the Comparative Examples 1 was applied on glass by spin coating, and then subjected to preheating treatment at about 110° C. for 70 sec to form the uniform film having the thickness of about 3.7 μm.

After the film was exposed in an exposure intensity of 40 mJ/cm² under the high pressure mercury lamp by using a circular isolated pattern type of photomask having the diameter of 14 μm, the pattern was developed by the KOH alkali aqueous solution having the pH of 11.3 to 11.9 and washed by deionized water. After the pattern was subjected to postheating treatment at 230° C. for about 20 min, physical properties of the pattern were measured by the following method, and the results are shown in the following Table 2.

1) Lower CD (Critical-Dimension)

The size of the pattern manufactured in the same exposure intensity of 40 mJ/cm² in the Examples and the Comparative Examples was measured by the pattern profiler, and the diameter of the portion corresponding to 10% of the lower part was represented by the lower CD. Since the exposure was performed in the same exposure intensity, the composition using the initiator having the good photoinitiation efficiency was more desirably crosslinked during the exposure to form the bigger pattern, accordingly, it can be said that the higher the CD value is, the better the sensitivity is.

2) Upper CD (Critical-Dimension)

The size of the pattern manufactured in the same exposure intensity of 40 mJ/cm$^2$ in the Examples and the Comparative Examples was measured by the pattern profiler, and the diameter of the portion corresponding to 5% of the upper part was represented by the upper CD. Since the exposure was performed in the same exposure intensity, the composition using the initiator having the good photoinitiation efficiency was more desirably crosslinked during the exposure to form the bigger pattern, accordingly, it can be said that the higher the CD value is, the better the sensitivity is.

TABLE 2

|  | Photoactive compound | Lower CD (μm) | Upper CD (μm) |
|---|---|---|---|
| Example 1 | Compound (1) | 34.1 | 17.0 |
| Example 2 | Compound (4) | 33.5 | 16.7 |
| Example 3 | Compound (5) | 34.2 | 16.6 |
| Example 4 | Compound (6) | 35.2 | 17.2 |
| Comparative Example 1 | OXE-02 | 30.7 | 14.6 |

As shown in Table 1, in the case where the photoactive compound including the nitro group and the phosphonate structure according to the present invention is used as the photopolymerization initiator of the photosensitive resin composition, a sensitivity property can be improved, which is preferable.

The results can be confirmed from the fact that the patterns generated in Examples 1 to 4 have the upper CD and the lower CD that are larger than those of the pattern manufactured in Comparative Example 1.

EXAMPLE 5

Manufacturing of the Colored Photosensitive Resin Composition 95 g of the carbon dispersion solution (the content of included carbon was 20 wt %), 5 g of the alkali-soluble cardo-based binder {acrylic acid-added bisphenol fluoreneepoxy acrylate/1,3-cyclohexyl diisocyanate (molar ratio 65/35, Mw=5000, acid value 80 KOH mg/g)}, 3 g of the alkali-soluble acryl-based binder {benzyl methaacrylate/N-phenylmaleimide/styrene/methaacrylic acid (molar ratio 60/10/12/18, Mw=15000, 80 KOH mg/g)}, 3 g of dipentaerythritol hexaacrylate that was the polymerizable compound having the ethylenically unsaturated bond, 2.5 g of compound (1) synthesized as the photoactive compound in Synthetic Example 1, 0.5 g of KBM-503 that was the adhesion aid, 0.1 g of F-475 (DIC Co., Ltd.) that was the surfactant and 164.5 g of PGMEA that was the solvent were mixed by using the shaker for 5 hours to obtain the colored photosensitive resin composition solution.

EXAMPLE 6

Manufacturing of the Colored Photosensitive Resin Composition

The colored photosensitive resin composition was manufactured by using the same method as Example 5, except that 2.5 g of compound (2) obtained in Synthetic Example 2 was used instead of compound (1) synthesized in Synthetic Example 1 as the photoactive compound.

EXAMPLE 7

Manufacturing of the Colored Photosensitive Resin Composition

The colored photosensitive resin composition was manufactured by using the same method as Example 5, except that 2.5 g of compound (3) obtained in Synthetic Example 3 was used instead of compound (1) synthesized in Synthetic Example 1 as the photoactive compound.

COMPARATIVE EXAMPLE 2

Manufacturing of the Colored Photosensitive Resin Composition

The colored photosensitive resin composition was manufactured by using the same method as Example 5, except that 2.5 g of Irgacure OXE-02 (BASF, Co., Ltd.) of compound (7) was used instead of compound (1) of Table 1 as the photoactive compound.

COMPARATIVE EXAMPLE 3

Manufacturing of the Colored Photosensitive Resin Composition

The colored photosensitive resin composition was manufactured by using the same method as Example 5, except that 2.5 g of compound (8) of Table 1 was used instead of compound (1) synthesized in Synthetic Example 1 as the photoactive compound.

COMPARATIVE EXAMPLE 4

Manufacturing of the Colored Photosensitive Resin Composition

The colored photosensitive resin composition was manufactured by using the same method as Example 5, except that 2.5 g of compound (9) of Table 1 was used instead of compound (1) synthesized in Synthetic Example 1 as the photoactive compound.

Evaluation of Physical Properties 2

The colored photosensitive resin compositions manufactured in Examples 5 to 7 and Comparative Examples 3 and 4 were applied on glass by spin coating, and then subjected to preheating treatment at about 100° C. for 100 sec to form the coat having the thickness of about 1.3 μm. Thereafter, the coat was cooled at room temperature, and then exposed in the exposure intensity of 50 mJ/cm$^2$ under the high pressure mercury lamp by using the line pattern type of photomask having the line width of 10 μm. The exposed substrate was developed in the spray manner in the 0.04% KOH aqueous solution at 25° C. for 50 sec, washed by pure water, dried, and post-baked in the convection oven at 230° C. for 30 min. Physical properties of the generated pattern were measured by the following method, and the results are shown in the following Table 3.

1) Developability

The case where the pattern is favorably formed after developing is represented by O, and the case where the pattern is not cleanly generated and a straight property is poor due to low developability is represented by X.

2) Pattern CD (Critical-Dimension)

The sizes of the patterns manufactured in the same exposure intensity of 50 mJ/cm$^2$ in the Examples and the Comparative Examples were measured by the SEM, and the line width of the lower part was represented by the pattern CD. Since the exposure was performed in the same exposure intensity, the composition using the initiator having the good photoinitiation efficiency was more desirably crosslinked during the exposure to form the bigger pattern, accordingly, it can be said that the higher the CD value is, the better the sensitivity is.

TABLE 3

|  | Photoactive compound | Developability | Pattern CD (μm) |
| --- | --- | --- | --- |
| Example 5 | Compound (1) | O | 10.9 |
| Example 6 | Compound (2) | O | 10.4 |
| Example 7 | Compound (3) | O | 10.4 |
| Comparative Example 2 | OXE-02 | X | 10.9 |
| Comparative Example 3 | Compound (8) | X | 13.5 |
| Comparative Example 4 | Compound (9) | O | 7.3 |

As shown in Table 3, in the case where the photoactive compound including the nitro group and the phosphonate structure according to the present invention is used as the photopolymerization initiator of the photosensitive resin composition, developability and a sensitivity property can be improved, which are preferable.

Figure 1:
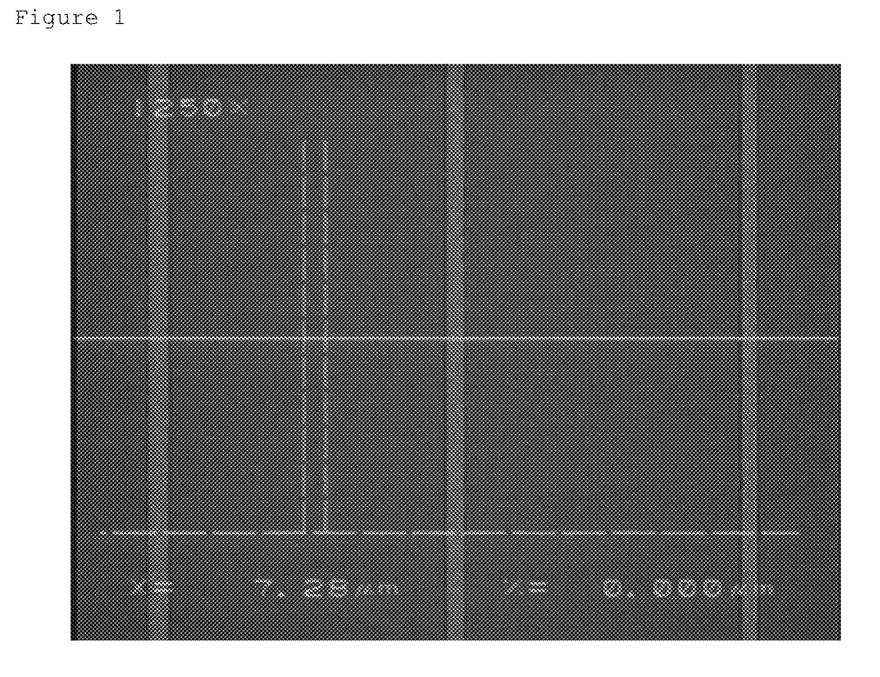
FIG. 1 illustrates patterns formed in Examples 5 to 7.
Figure 2:
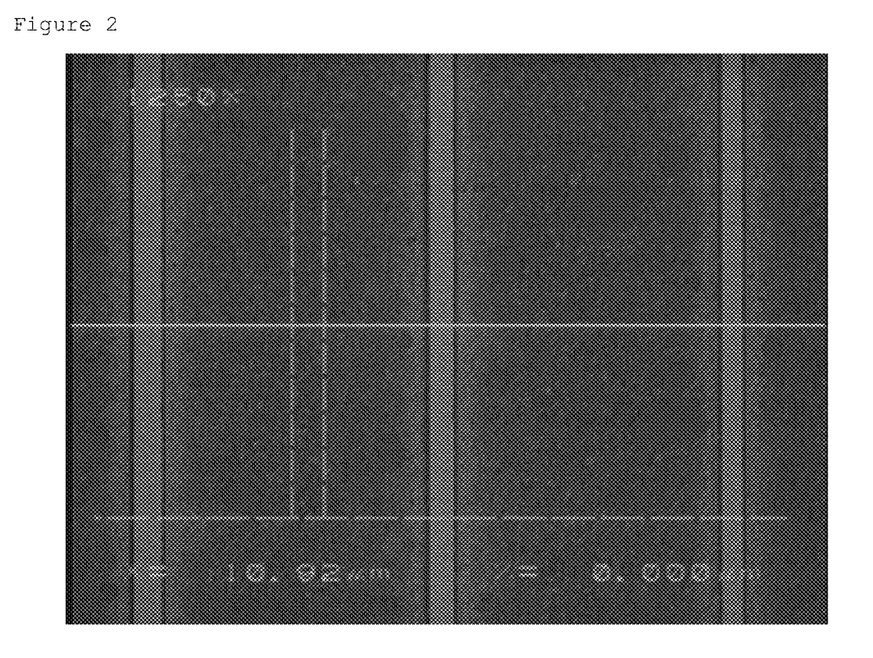
FIG. 2 illustrates patterns formed in Comparative Examples 2 and 3.

The results show that, as shown in FIG. 1, the patterns generated in Examples 5 to 7 have excellent developability to allow developing to be cleanly performed and have an excellent straight property of the pattern. However, it can be confirmed that the patterns formed in Comparative Example 2 and Comparative Example 3 have poor developability, thus, developing is not well performed as shown in FIG. 2, and the straight property is poor. This is assumed because the phosphonate group included in compounds 1 to 3 applied to the Examples increases compatibility with the solvent and other components to increase developability. In the case of Comparative Example 4, developability was excellent, but the pattern CD was low, thus, the sensitivity property was not satisfactory. Accordingly, in the case of the colored photosensitive resin composition to which the compound of the Example is applied, it can be confirmed that developability, the straight property and sensitivity are excellent.

The invention claimed is:

1. A photoactive compound represented by the following Formula 1:

[Formula 1]

wherein $R^1$ is a $C_1$~$C_8$ alkyl group; or a $C_6$~$C_{12}$ aryl group,
$R^2$ is a $C_1$~$C_8$ alkyl group; or a $C_1$~$C_8$ alkyl group substituted by one or more substituent groups selected from the group consisting of R, OR, SR and COR,
$R^3$ and $R^4$ are hydrogen; or are connected to each other to form a condensed ring,
$R^5$ is a $C_1$~$C_8$ alkyl group; or a $C_6$~$C_{12}$ aryl group,
A is a $C_2$~$C_{15}$ alkylene group; or a $C_2$~$C_{15}$ alkylene group substituted by one or more substituent groups selected from the group consisting of R, OR, SR, COR and OCOR, and
R is selected from a $C_1$~$C_{10}$ alkyl group; a $C_1$~$C_{10}$ haloalkyl group; or a $C_7$~$C_{13}$ aralkyl group.

2. The photoactive compound of claim 1, wherein $R^1$ of Formula 1 is a methyl group or a phenyl group,
$R^2$ is an ethyl group or a methyl group,
$R^5$ is a methyl group or an ethyl group, and
A is a hexylene group or a propylene group.

3. A photosensitive resin composition comprising:
a) a photoactive compound represented by the following Formula 1;
b) an alkali-soluble binder resin;
c) a polymerizable compound having an ethylenically unsaturated bond; and
d) a solvent:

[Formula 1]

wherein $R^1$ is a $C_1$~$C_8$ alkyl group; or a $C_6$~$C_{12}$ aryl group,
$R^2$ is a $C_1$~$C_8$ alkyl group; or a $C_1$~$C_8$ alkyl group substituted by one or more substituent groups selected from the group consisting of R, OR, SR and COR, R³ and R⁴ are hydrogen; or are connected to each other to form a condensed ring, $R^5$ is a $C_1$~$C_8$ alkyl group; or a $C_6$~$C_{12}$ aryl group, A is a $C_2$~$C_{15}$ alkylene group; or a $C_2$~$C_{15}$ alkylene group substituted by one or more substituent groups selected from the group consisting of R, OR, SR, COR and OCOR, and R is selected from a $C_1$~$C_{10}$ alkyl group; a $C_1$~$C_{10}$ haloalkyl group; or a $C_7$~$C_{13}$ aralkyl group.

4. The photosensitive resin composition of claim 3, wherein $R^1$ is a methyl group or a phenyl group, $R^2$ is an ethyl group or a methyl group, $R^5$ is a methyl group or an ethyl group, and A is a hexylene group or a propylene group.

5. The photosensitive resin composition of claim 3, wherein an acid value of the alkali-soluble binder resin is 30 to 300 KOH mg/g.

6. The photosensitive resin composition of claim 3, wherein a weight average molecular weight of the alkali-soluble binder resin is 1,000 to 200,000.

7. The photosensitive resin composition of claim 3, wherein a content of the photoactive compound of Formula 1 is 0.1 to 5 wt % based on a total weight of the photosensitive resin composition.

8. The photosensitive resin composition of claim 3, wherein a content of the alkali-soluble binder resin is 1 to 30 wt % based on a total weight of the photosensitive resin composition.

9. The photosensitive resin composition of claim 3, wherein a content of the polymerizable compound having the ethylenically unsaturated bond is 0.5 to 30 wt % based on a total weight of the photosensitive resin composition.

10. The photosensitive resin composition of claim 3, wherein a content of the solvent is 40 to 95 wt % based on a total weight of the photosensitive resin composition.

11. The photosensitive resin composition of claim 3, further comprising:

a colorant.

12. The photosensitive resin composition of claim 11, wherein the colorant is included in a content of 1 to 20 wt % based on a total weight of the photosensitive resin composition.

13. The photosensitive resin composition of claim 3, further comprising:

a second photoactive compound.

14. The photosensitive resin composition of claim 13, wherein the second photoactive compound is included in a content of 0.1 to 5 wt % based on a total weight of the photosensitive resin composition.

15. The photosensitive resin composition of claim 3, further comprising:

one or two or more additives selected from the group consisting of a curing accelerator, a thermal polymerization inhibitor, a dispersing agent, an antioxidant, a UV absorbent, a leveling agent, a photosensitizer, a plasticizer, an adhesion promoter, a filler and a surfactant.

16. The photosensitive resin composition of claim 15, wherein the additives are each included in a content of 0.01 to 5 wt % based on a total weight of the photosensitive resin composition.

17. A photosensitive material manufactured by using the photosensitive resin composition of claim 3.

18. An electronic device comprising the photosensitive material of claim 17.

* * * * *